United States Patent
Mohanty

(10) Patent No.: US 11,681,894 B2
(45) Date of Patent: Jun. 20, 2023

(54) CONNECTED SMART COUNTER

(71) Applicant: Manish Mohanty, Georgetown, TX (US)

(72) Inventor: Manish Mohanty, Georgetown, TX (US)

(73) Assignee: Manish Mohanty, Georgetown, TX (US)

( * ) Notice: Subject to any disclaimer, the term of this patent is extended or adjusted under 35 U.S.C. 154(b) by 483 days.

(21) Appl. No.: 16/994,568

(22) Filed: Aug. 15, 2020

(65) Prior Publication Data
US 2021/0073609 A1   Mar. 11, 2021

Related U.S. Application Data

(60) Provisional application No. 62/898,987, filed on Sep. 11, 2019.

(51) Int. Cl.
| | |
|---|---|
| *H03K 21/00* | (2006.01) |
| *G06M 3/06* | (2006.01) |
| *G06M 1/22* | (2006.01) |
| *G06M 1/10* | (2006.01) |
| *G06M 3/08* | (2006.01) |

(Continued)

(52) U.S. Cl.
CPC ............. *G06M 3/06* (2013.01); *G06M 1/108* (2013.01); *G06M 1/22* (2013.01); *G06M 3/08* (2013.01); *H03K 21/18* (2013.01); *H03K 21/38* (2013.01)

(58) Field of Classification Search
CPC .......... G06M 3/06; G06M 1/108; G06M 1/22; G06M 3/08; H03K 21/38; H03K 21/18
See application file for complete search history.

(56) References Cited

U.S. PATENT DOCUMENTS

| | | | | |
|---|---|---|---|---|
| 4,965,553 | A | * | 10/1990 | DelBiondo, II ... G08B 21/0453 708/111 |
| 6,484,260 | B1 | * | 11/2002 | Scott ..................... G07F 7/1008 713/182 |
| 10,009,579 | B2 | | 6/2018 | Wang et al. |

(Continued)

FOREIGN PATENT DOCUMENTS

| | | |
|---|---|---|
| CN | 106779865 A | 5/2017 |
| CN | 106802959 A | 6/2017 |
| JP | 6276519 B2 | 2/2018 |

OTHER PUBLICATIONS

Carlo Pane, Marco Gasparini, Andrea Prati, Giovanni Gualdi, Rita Cucchiara, A People Counting System for Business Analytics, 2013, 7 pages.

(Continued)

*Primary Examiner* — Tuan T Lam
(74) *Attorney, Agent, or Firm* — Hipp Law

(57) ABSTRACT

Approaches describe a mobile computing device, e.g., an ergonomically configured connected counting device, to capture counts of people, products, or any countable object, store the counts and associated information in a central repository for access by other connected counting devices. The counts and associated qualifying information can then be displayed through mobile devices and web applications, and can display count data with sales, demographic and other qualifying data sources to provide information for qualitative and quantitative reporting, as well as enable count based automated promotions through traditional channels and social networks.

20 Claims, 10 Drawing Sheets

(51) Int. Cl.
*H03K 21/38* (2006.01)
*H03K 21/18* (2006.01)

(56) References Cited

U.S. PATENT DOCUMENTS

| | | |
|---|---|---|
| 10,579,827 B2 | 3/2020 | Telford et al. |
| 2009/0327006 A1 | 12/2009 | Hansan et al. |
| 2017/0178535 A1* | 6/2017 | Vignola ................. G06F 3/0482 |
| 2017/0330471 A1* | 11/2017 | Subiakto .............. G11B 33/025 |
| 2019/0206066 A1 | 7/2019 | Saleemi et al. |
| 2019/0324543 A1* | 10/2019 | Kazdan .................. G06F 3/011 |
| 2019/0325588 A1 | 10/2019 | Saleemi et al. |
| 2020/0005356 A1 | 1/2020 | Greenberger et al. |

OTHER PUBLICATIONS

M. S. Sruthi, IoT Based Real Time People Counting System for Smart Buildings, Feb. 2, 2019, 4 pages.

Yang, Gonzalez-Banos, Guibas, Counting People in Crowds With a Real-Time Network of Simple Image Sensors, Oct. 16, 2003, 3 pages.

* cited by examiner

CONNECTED SMART COUNTER

CROSS-REFERENCES TO RELATED APPLICATIONS

This application claims priority to U.S. Provisional Application No. 62/898,987, entitled "CONNECTED SMART COUNTER," filed Sep. 11, 2019 which the full disclosure of this application is incorporated herein by reference for all purposes.

BACKGROUND

Many people need to count as a part of their day to day tasks or hobbies. Conventional devices used for counting include mechanical tally counters and/or mobile apps and are limited in the features offered. For example, while tally counters are easy to operate and affordable, there is no provision of saving the counts, and a user of such a device has to manually save the counts for future reference. Mobile apps, on the other hand, can save the counts but do not analyze or are limited in the analysis of the counts. Further, mobile apps require a mobile phone to operate, which can be expensive. Further still, mobile phones typically do not have dedicated hardware for counting, which may result in additional steps for a user to begin counting. This can be frustrating to many users and may result in reduced use of such apps for counting. Further yet, mobile phones are typically not designed to minimize physical discomfort, especially when used for an extended period of time. Accordingly, it is desirable to provide improved devices and techniques for counting objects.

SUMMARY

This summary is provided to introduce a selection of concepts in a simplified form that are further described below in the Detailed Description. This summary is not meant or intended to identify or exclude key features or essential features of the claimed subject matter, nor is it intended to be used as an aid in determining the scope of the claimed subject matter.

In one aspect, embodiments relate to a counting device that includes a housing having a front portion, a back portion, a top portion, and a bottom portion, the bottom portion having a grip section that includes a through-hole sized for at least one finger to pass through, the housing having an ergonomic shape that is quantified based on a biomechanical neutral position; a controller comprising a set of input buttons an increment button operable to increment a count and a decrement button operable to decrement the count; a display screen configured to display at least one of a total count or an absolute count based on user input at a plurality of counting devices; and a memory device including instructions that, when executed by the counting device, enables the counting device to: receive configuration information, analyze the configuration information to associate the set of input buttons with a category, receive a user selection of one of the set of input buttons, and provide the user selection to a remote computing device for processing.

In some embodiments, the biomechanical neutral position is based on an alignment of bodily features satisfying a threshold degree of alignment.

In some embodiments, the alignment of the bodily features is between a first target area of a first bodily feature and a second target area of a second bodily feature.

In some embodiments, the first bodily feature corresponds to a radius bone and the second bodily feature corresponds to a proximal interphalangeal joint of an index finger of a user.

In some embodiments, the bottom portion forms a comfortable naturally extended grip surface.

In some embodiments, the biomechanical neutral position allows a user to contact the set of input buttons without changing a grasp on the counting device.

In some embodiments, the counting device further includes a second set of input buttons, the second set of input buttons including a second increment button and a second decrement button.

In some embodiments, the set of input buttons is configured to count a first group of objects and the second set of input buttons is configured to count a second group of objects.

In some embodiments, the ergonomic shape enables a user to conduct thumb-typing while a hand, a wrist, and a forearm of the user is in the biomechanical neutral position.

In some embodiments, the counting device is further configured to provide count data from a plurality of counting devices to the counting device for display.

In some embodiments, the counting device is further configured to associate the user selection with one of position information, a time-stamp, image data, or audio data.

In some embodiments, the counting device further includes at least one of a camera, microphone, or messaging interface to provide at least one of audio, video, text, or pictorial qualification of counts.

In another aspect, embodiments relate to a system that includes a plurality of counting devices, individual counting devices having, a housing having a front portion, a back portion, a top portion, and a bottom portion, the bottom portion having a grip section that includes a through-hole sized for at least one finger to pass through, the housing having an ergonomic shape that is quantified based on a biomechanical neutral position, a controller comprising a set of input buttons an increment button operable to increment a count and a decrement button operable to decrement the count, and a display screen configured to display at least one of a total count or an absolute count based on user input at the plurality of counting devices; and at least one server configured to receive data representing a count of items.

In some embodiments, the counting system is further enabled to receive the count of the items, store the count of the items, and enable access to the count of the items by the plurality of counting devices.

In some embodiments, the counting system is further enabled to enable access to an interface displaying one of a category total of the count of the items or an absolute total of the count of the items.

In some embodiments, the counting system is further enabled to provide configuration information to one of the plurality of counting devices, the configuration information operable to associate the set of input buttons with a counting category, indicate an account for providing count data, display at least one category for counting, indicate a location for counting, or provide a layout to view count data.

In some embodiments, the counting system further includes a graphical user interface operable allow a user to access a count of the items.

In yet another aspect, embodiments relate to a computing device that includes a housing having a front portion, a back portion, a top portion, and a bottom portion, the bottom portion having a grip section that includes a through-hole sized for at least one finger to pass through, the housing having an ergonomic shape that is quantified based on a biomechanical neutral position; a controller comprising a set of input buttons an increment button operable to increment a count and a decrement button operable to decrement the count; and a display screen configured to display at least one of a total count or an absolute count based on user input at a plurality of counting devices.

In some embodiments, the biomechanical neutral position is based on an alignment of bodily features satisfying a threshold degree of alignment.

In some embodiments, the alignment of the bodily features is between a first target area of a first bodily feature and a second target area of a second bodily feature, and wherein the first bodily feature corresponds to a radius bone and the second bodily feature corresponds to a proximal interphalangeal joint of an index finger of a user.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not, therefore, to be considered to be limiting of its scope, the principles herein are described and explained with additional specificity and detail through the use of the accompanying drawings in which.

DETAILED DESCRIPTION

Systems and methods in accordance with various embodiments of the present disclosure may overcome one or more of the aforementioned and other deficiencies experienced in conventional approaches to counting objects. In particular, various embodiments describe an ergonomically configured handheld input device configured to capture counts of objects (e.g., people, products, or other countable objects) and store data representative of the counts as well as additional data associated with the counts for use in other processes. In an embodiment, the ergonomic device can accommodate the hands of a user while the thumb is associated with buttons on the device. The overall configuration of the device and the arrangement of the buttons permit the user to operate the functions provided by the device while the forearms, fingers, wrist, etc. are within a biomechanically neutral zone.

In various embodiments, the device can receive configuration information. The configuration information includes instructions that, when processed by the device, can configure one or more sets of input buttons for counting one or more categories, indicate an account for providing counting and other data, the categories for counting, a location for counting (e.g., gate, entrance, exit), etc. For example, each set of buttons (e.g., an increment button and a decrement button) can be assigned to particular counting category, the display screen can be configured to show particular count information, along with an indication of the account owner and information for a location to count.

A plurality of connected counting devices, mobile devices, and/or web applications can communicate with a remote count management system or other such system or service to display counts and associated qualifying information. The qualifying information can be used to associate count data with, e.g., sales, demographic, and other qualifying data sources, to provide information related to qualitative and quantitative reporting. In some examples, the count and associated information can be used to enable count-based automated promotions through traditional channels and social networks. The system can create analytics and charts from the counts in real-time to add contextual information and insights to the counts and improve decision making. The system can synchronize with other counters to maintain accurate counts without relying on manual counting approaches.

Advantageously, embodiments described herein allow a user to count multiple items simultaneously, save count data automatically and in real-time, allow users to view the counts in real-time, syncs with other counters to maintain accurate counts for an establishment, provides avenues to add qualifying comments with pictures, audios, and videos, and creates analytics and charts from the counts in real-time. Various other functions and advantages are described and suggested below as may be provided in accordance with the various embodiments.

Figures 1A, 1B:
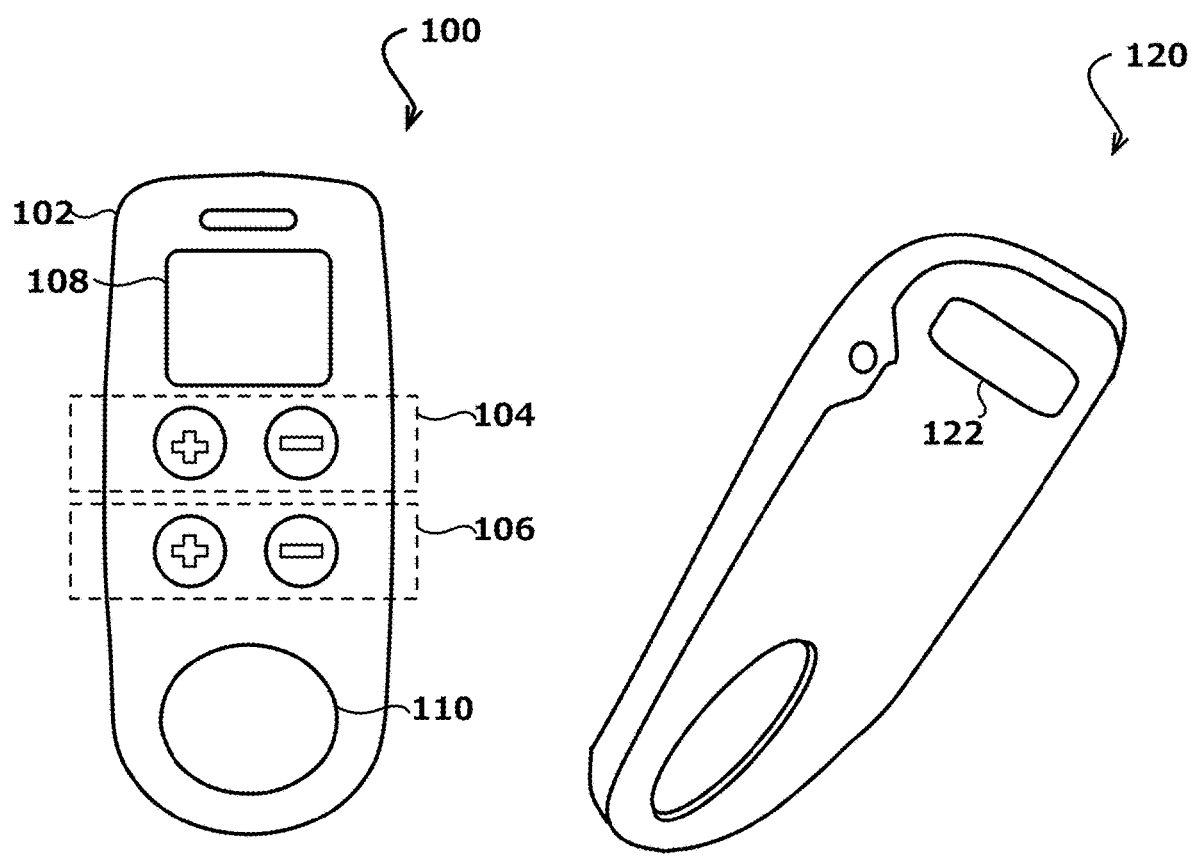
FIGS. 1A and 1B illustrate a counting device in accordance with various embodiments.

FIGS. 1A and 1B illustrate a counting device in accordance with various embodiments. It should be understood that reference numbers are carried over between figures for similar components for purposes of simplicity of explanation, but such usage should not be construed as a limitation on the various embodiments unless otherwise stated. As described, many people need to count as a part of their day to day tasks or hobbies. Conventional devices used for counting include tally counters and/or mobile apps. While available, these devices are limited in the features offered. For example, tally counters are easy and affordable, but there is no provision of saving the counts, and the counts have to be manually saved for future reference. Additionally, because the count across multiple counters does not sync, it is difficult and, at times, impossible to obtain an accurate count of occupancy. On the other hand, mobile apps can save the counts but do not analyze the counts to offer charts and graphs. Additionally, in many situations, both are for single-party use only. Other parties interested in the counts do not have access to this information. Further, these approaches do not allow a user to save the counts, synchronize the counts to maintain accurate counts across multiple users, analyze the count data automatically and in real-time, share the data in real-time, allow association of pictures/video/audio to provide context to the count, scan badges, identification information, and QR codes or other data matrices to automatically update counts. Accordingly, in accordance with various embodiments, approaches described herein provide systems, methods, and devices that allow a user to count multiple items simultaneously, so the user does not have to carry multiple tally counters. It saves the data automatically, thus eliminating delays and errors. It allows other users to see the counts and trends immediately, so stakeholders stay informed. It synchronizes with other counters to maintain accurate counts without relying on manual tallying. It enables users to add comments, pictures, audios, and videos to provide context to the counts. It allows scanning of images and QR codes to maintain count related lists so hosts can track how many and who attend their events. It provides walkie talkie and flashlight features, so security personnel maintaining crowds do not need to carry separate walkie talkies and flashlights on top of their tally counters. Additionally, it creates analytics and charts from the counts in real-time to add meaning to the counts and improve decision making.

For example, FIG. 1A illustrates example 100 of a front view of counting device 102. Although a dedicated counting device is described, it should be understood that any device capable of receiving and processing input can be used in accordance with various embodiments discussed herein, where the devices can include, for example, head-mounted displays, notebook computers, personal data assistants, cellular phones, smart glasses or goggles, smartwatch, unmanned vehicles such as drones, and portable media players, among others. In this example, a counting device can include a controller section having one or more sets of input buttons. As shown, device 102 includes input button set 104 and input button set 106. Set 104 and set 106 can include an increment button and a decrement button. The increment button can be configured to increase a counter, and the decrement button can be configured to decrease the counter. The increment button in an embodiment can correspond to the button with the plus symbol, and the decrement button can correspond to the button with the minus symbol. Device 102 can be ergonomically designed to allow a user to conduct thumb-typing while the hands, wrists, and forearms of the user are in a relaxed, comfortable, and neutral position.

Counting device 102 can include an interface or other display element 108. The display element 108 can display count information. For example, the display screen can display a total count, which can correspond to the number of times the increment buttons are pressed minus the number of times the decrement buttons are pressed. In at least some embodiments, information that may be particularly relevant can include a rate at which the total count is increasing or decreasing, a count for different objects (e.g., a count or adults and a count for children), battery information, network connection strength, total number of counters for a counting session, etc.

Counting device 102 includes a housing having a front portion, a back portion, a top portion, and a bottom portion. The bottom portion can include a grip section that includes through-hole 110 sized for at least one finger to pass through. The housing can have an ergonomic shape quantified based on a biomechanical neutral position of a person's hand, wrist, fingers, foreman, etc. As will be described further herein, ergonomic criteria for each point of contact between the user and the counting device can be quantified and incorporated such that the user can grasp and use the counting device in a biomechanical neutral position. Such a neutral position can be achieved when the flexors and extensors of the user's hands and wrists are in equilibrium, where intracarpal pressure is minimized, and flexors and extensor muscles are positioned for optimal application of strength.

The counting device 102 may include at least one image capturing component 122 (such as a rear-facing camera), as illustrated in example 120 of FIG. 1B. The counting device 102 can also include one or more microphones or other audio capture devices capable of capturing audio data. In some embodiments, a microphone can be placed on the same side of the counting device 102 as the display screen, such that the microphone will typically be better able to capture words spoken by a user of the device. In at least some embodiments, the microphone can be a directional microphone that captures sound information from substantially directly in front of the device and picks up only a limited amount of sound from other directions, which can help to capture better words spoken by a primary user of the device. In other embodiments, a computing device may include multiple microphones arranged to capture three-dimensional audio.

In some embodiments, the imaging element of the counting device 102 can include multiple cameras, including at least one wide-angle optical element, such as a fisheye lens, on each of the front surface and the back surface of the device, that enables the device to capture images over a wide range of angles, up to 360 degrees vertically or horizontally, with respect to the device. Further, each image capture element can comprise a digital still camera, configured to capture subsequent frames in rapid succession, or a video camera able to capture streaming video. Further still, the camera can be used as a scanner to validate the identity or age of a patron.

The device can include buttons, dials, switches, touchscreens, and the like which can be used to count different categories of objects (e.g., adults, children, etc.) The counts can be displayed on a screen or other displays.

The device can include a micro-controller and storage (e.g., volatile memory or nonvolatile memory) that can be used to store the counts, text, audio, and video. The micro-controller can also send data representative of the counts using a wireless (such as Wi-Fi or Cellular) network to a centralized database or other destination, such as an email account, printer, collaborative counting system, etc. The data can be sent at pre-defined or configurable intervals, on-demand when initiated by a user or another device, in response to satisfying one or more threshold (e.g., a count threshold, a time threshold, etc.)

In an embodiment, the counting device 102 can include Wi-Fi and Cellular connectivity components, touchscreen keyboard, flashlight, speakers, or any combination thereof to allow easy counting, adding of qualifying information through text, pictures, video, and audio, and transferring of data to a remote system (e.g., server, database, etc.)

In certain embodiments, the counting device 102 can include a software application ("app") configured to allow users to count, in real-time, a set of data. The app can also be used to count multiple sets of data, such as a number of men and a number of women. The app may be configured to run on a computing device, such as a smartwatch, smartphone, tablet, or any other computing device that allows input to the counter app. The app or computing device may include a wireless network connectivity module to transmit of data from the app to a server, which may be done periodically. The software application may include a plus and minus function, such as activated by a mechanical button or software button, to increase or decrease a respective count.

The device can in various embodiments communicate with a collaborative counting system or other such system where data can be processed at the system and used to execute promotions or customize messaging based on count thresholds and associated criteria, run reports for analysis, display information through web and mobile apps, or a combination thereof.

Figure 2:
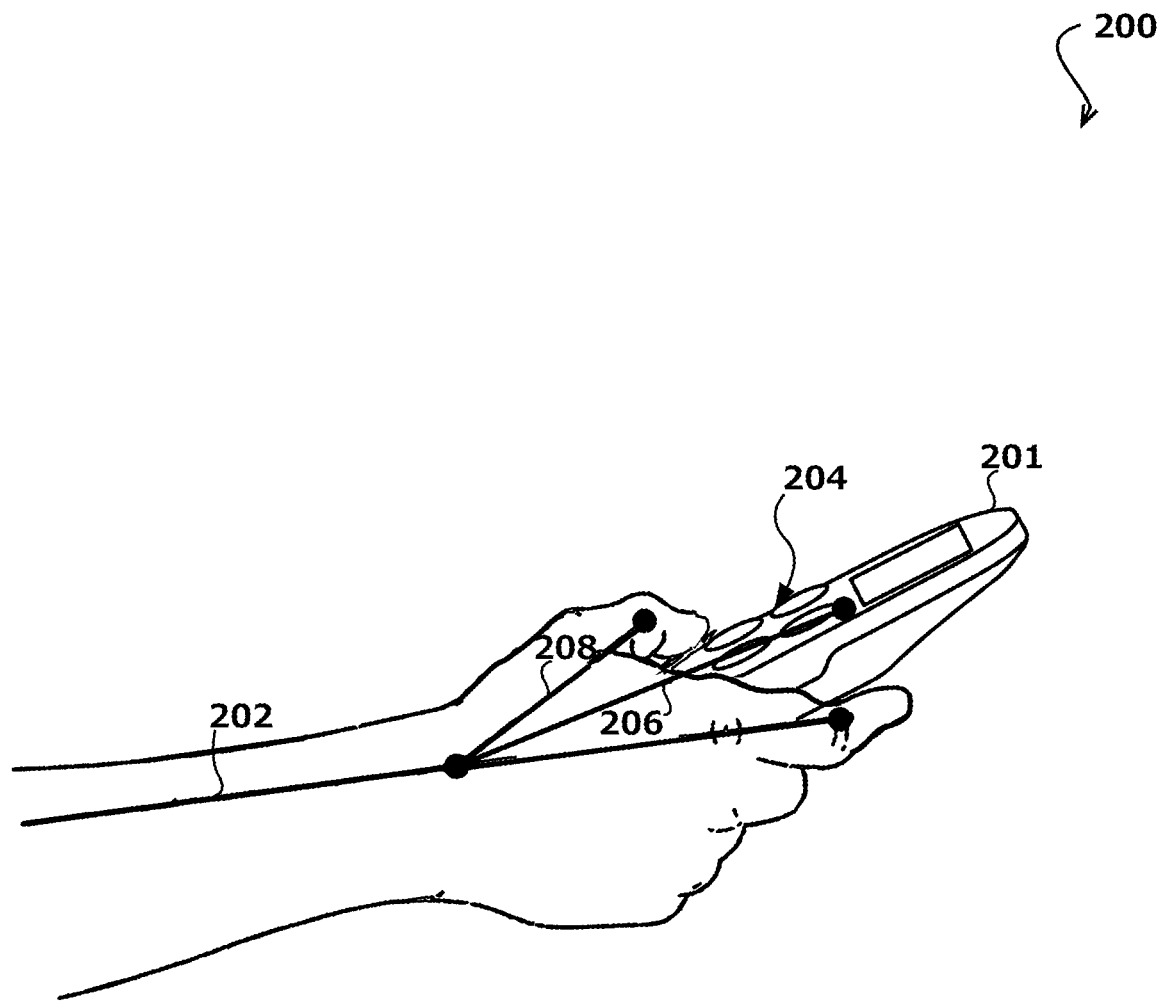
FIG. 2 is a side view of a user's hands associated with a handheld connected counting device in accordance with various embodiments.

FIG. 2 is a side view of a user's hands associated with the handheld connected counting device in accordance with various embodiments. In this example, ergonomic criteria for points of contact between one or more bodily features (e.g., a hand of a user) and the handheld counting device 201 is quantified and incorporated such that the user can grasp and use the handheld counting device in a biomechanical neutral position. Such a neutral position can be achieved when the flexors and extensors of one or more bodily features of the user (e.g., the user's hands and wrists) are in equilibrium, where intracarpal pressure is minimized, and flexors and extensor muscles are positioned for optimal application of strength. As illustrated in example 200 of FIG. 2, a biomechanically neutral zone can be achieved when the user can control the handheld counting device with the wrist, hand, and joints at a particular position or within an acceptable deviation of those positions with respect to, e.g., a flat surface. For example, a biomechanically neutral zone can be achieved with the wrist is within a first range (e.g., 15-20 degrees), the hand having an ulnar deviation within a second range (e.g., 8-12 degrees), the index finger, the middle finger, the ring finger, and the little finger, respectively are flexed about 45 degrees, the proximal interphalangeal joints are flexed in a range about 30 degrees to 45 degrees, the distal interphalangeal joints are flexed in a range about 10 degrees to 20 degrees, the first metacarpals (metacarpal of the thumb) are partially abducted (tending toward pronation), the first metacarpals are opposed metacarpals of digits 2 through 5, the metacarpal-phalangeal joints of the thumb is flexed about 10 degrees, the interphalangeal joints of the thumb is flexed about 5 degrees, and the angle of the second metacarpals are about 15 degrees abduction from each respective radius. In the biomechanical neutral position, approximately zero-degree alignment is achieved from the radius to the 2nd proximal interphalangeal joint (proximal interphalangeal joint of the index finger of each hand), as illustrated by line 202.

It should be noted that with a hand on a flat surface, the radial deviation is the rotation of the wrist toward the thumb, and ulnar deviation is the rotation of the wrist toward the little finger. Both radial deviation and ulnar deviation can be measured relative to a reference axis. In an example, the reference axis can pass through the center of a wrist joint of a hand operating the counting device. Wrist extension can be measured as an angle created by an inclination of a hand plane relative to a horizontal axis passing through the center of a wrist joint. The hand plane can be defined as the plane within which the second through fifth metacarpal bones reside. Supination can refer to rotation of the forearm and wrist such that the palm tends to face forward or upward and the radius tends to lie parallel to the ulna. Pronation can refer to rotation of the forearm and wrist such that the palm tends to face backward or downward.

Additionally, in the biomechanical neutral position, the input buttons 204 are essentially parallel to the neutral hand position. For example, as illustrated in FIG. 2, plane 206 of the surface of the input buttons 204 is parallel to line 208 through the 1st metacarpal (metacarpal of the thumb). In the biomechanical neutral position, the functionality of the input buttons is available to the user. The user can increment and/or decrement a counter by press the appropriate button with the user's thumbs (thumb-typing). When using the handheld counting device, the user's hands and wrists are neutrally positioned within a range of positions. Additionally, thumb-typing and access to the input buttons is available while rotation of the metacarpal and phalange of a user's thumb is within a range of degrees.

Figure 3A:
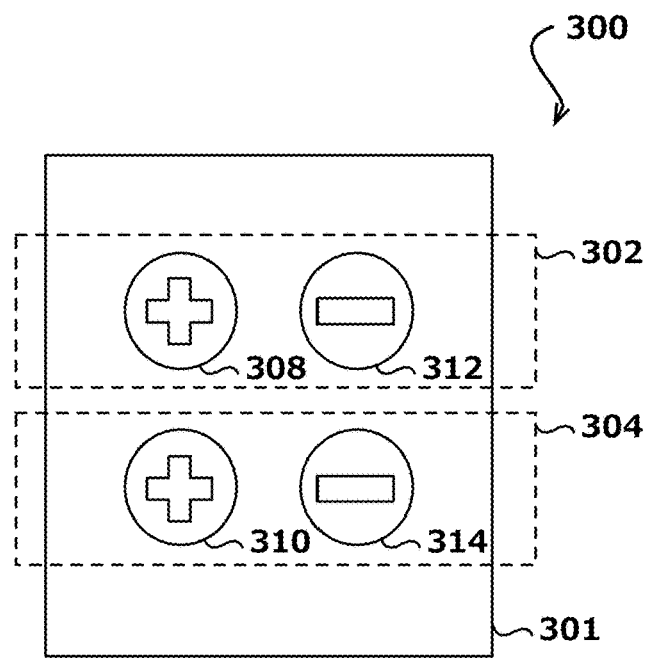
FIGS. 3A and 3B illustrate example sets of input buttons for a connected counting device in accordance with various embodiments.
Figure 3B:
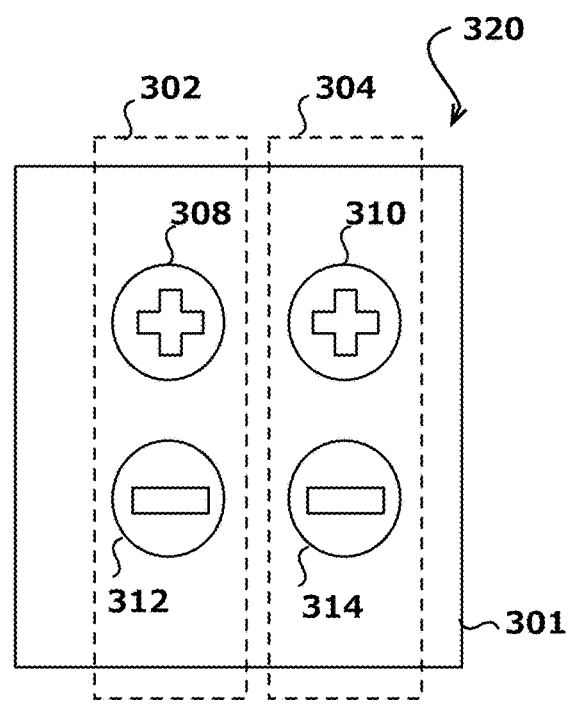

In various embodiments, a counting device can include one or more sets of input buttons. Example 300 of FIG. 3A illustrates an arrangement of a first set of input buttons and a second set of input buttons. In this example, keypad 301 includes input button set 302 and input button set 304. Set 302 and set 304 can include an increment button and a decrement button, for example, increment buttons 308 and 310 and decrement buttons 312 and 314. An increment button can be configured to increase a counter, and the decrement button can be configured to decrease the counter. Example 320 of FIG. 3B illustrates an alternative arrangement of the set of input buttons. In this example, buttons for input button set 302 and 304 are arranged vertically. For example, for input button set 302, increment button 308 is positioned vertically above decrement button 312. For input button set 304, increment button 310 is positioned vertically above decrement button 314. It should be noted that any one of a number arrangements can be utilized in accordance with embodiments described herein, and the arrangements illustrated are merely for exemplary. In accordance with various embodiments, the sizes and locations of the input keys provide comfortable input while a user's hand is in the biomechanical neutral position. In an embodiment, the surface of each key can be rounded and extended slightly from the surface of the counting device. Additionally, or alternatively, the surface of each key can have convex and concave contours so a user can identify a key via touch. The keys can provide tactile feedback allowing the user to select desired keys.

Figure 4A:
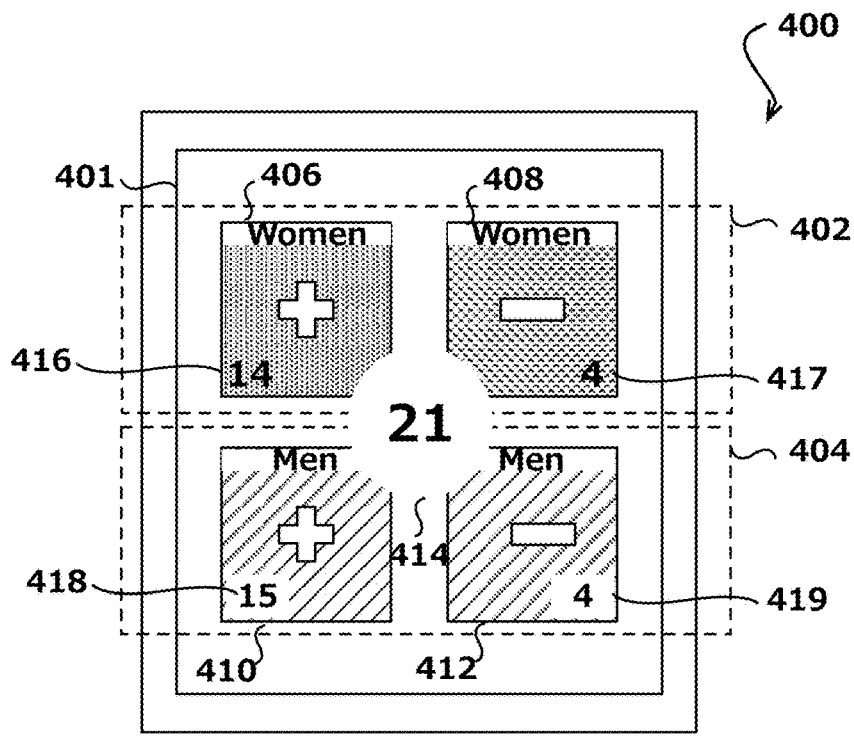
FIGS. 4A and 4B illustrate example sets of virtual input buttons for collaborative counting in accordance with various embodiments.

In various embodiments, one or more applications on mobile devices or other such devices can provide an interface that includes one or more sets of virtual buttons, count categories, total count, etc., that can be utilized for collaborative counting. For example, example 400 of FIG. 4A illustrates interface 401 that includes virtual input button set 402, virtual input button set 404, and total count 414. Virtual input button set 402 includes virtual increment button 406 and virtual decrement button 408. Virtual increment button 406 includes category count 416 for a particular category. In this example, category count for the category of women is 14. Virtual decrement button 408 includes decrement category count 417. In this example, decrement category count 417 for the category of women is 4. In accordance with various embodiments, a category can correspond to anything desired to be counted. Example categories include women, men, adults, children, dogs, cats, etc. It should be noted that any number of objects for any number of categories can be counted.

Virtual input button set 404 includes virtual increment button 410 and virtual decrement button 412. Virtual increment button 410 includes category count 418. In this example, category count 418 for the category of men is 15. Virtual decrement button 412 includes decrement category count 419. In this example, decrement category count 419 is 4.

When a user contacts (e.g., taps) an appropriate area on interface 401, such as an area including one of the virtual buttons, the count may be incremented or decremented based on the area contacted. For example, in the situation a user provides input (e.g., a touch-based input) on the portion of interface 401 corresponding to virtual button 406, category count 416 and absolute total count 414 can be incremented. In certain embodiments, a user may wear smart gloves, including, for example, Bluetooth rubber or latex gloves, where when a user tabs particular fingers together, the tab can be registered as a count and transmitted to the counting app for further processing.

Total count 414 can correspond to an absolute total count or a category total count. The absolute total count can represent the total number of increments for the categories less the total number of decrements for the categories. For example, in the situation the category count for women is 14, the category count for men is 15, the decrement count for women is 4, and the decrement count for men is 4, the absolute total count displayed is 21.

A category count can correspond to the total number of increments for a particular category less the total number of decrements for that category. For example, in the situation the category count for women is 14 and the decrement count for women is 4, the total category count displayed for the category of women is 10.

Figure 4B:
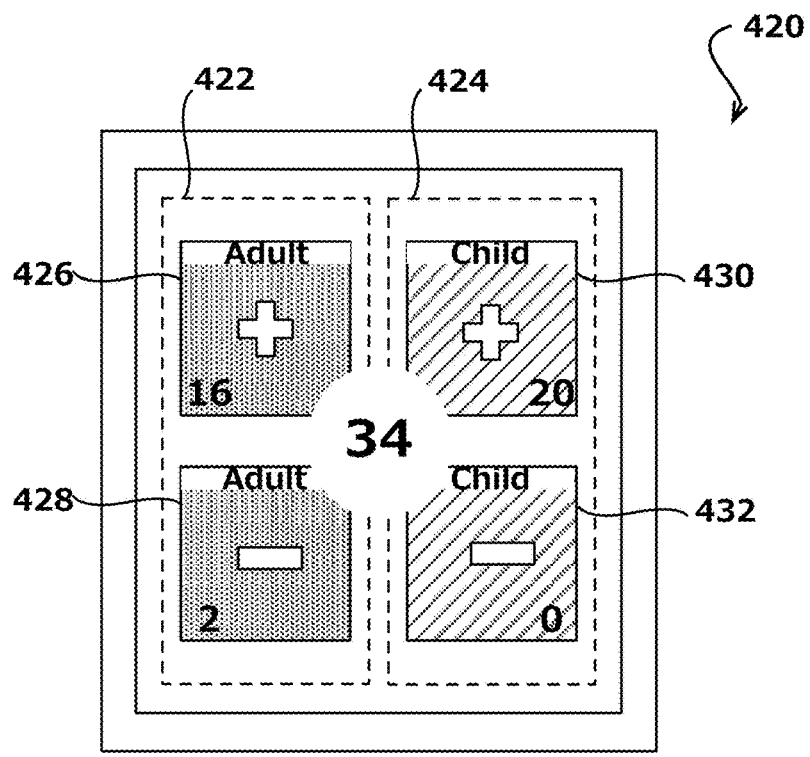

Example 420 of FIG. 4B illustrates an alternative arrangement of the set of virtual input buttons in accordance with various embodiments. In this example, virtual buttons for virtual input button sets 422 and 424 are arranged vertically. For example, for virtual input button set 422, virtual increment button 426 is positioned vertically above virtual decrement button 428. For virtual input button set 424, virtual increment button 430 is positioned vertically above virtual decrement button 432. It should be noted that any one of a number arrangements can be utilized in accordance with embodiments described herein, and the arrangements illustrated are merely for exemplary. It should be further noted that the categories counted may be one of any number of different categories. In this example, the category corresponding to virtual input button set 422 is set to adult, and the category corresponding to virtual input button set 424 is set to child.

Figure 5A:
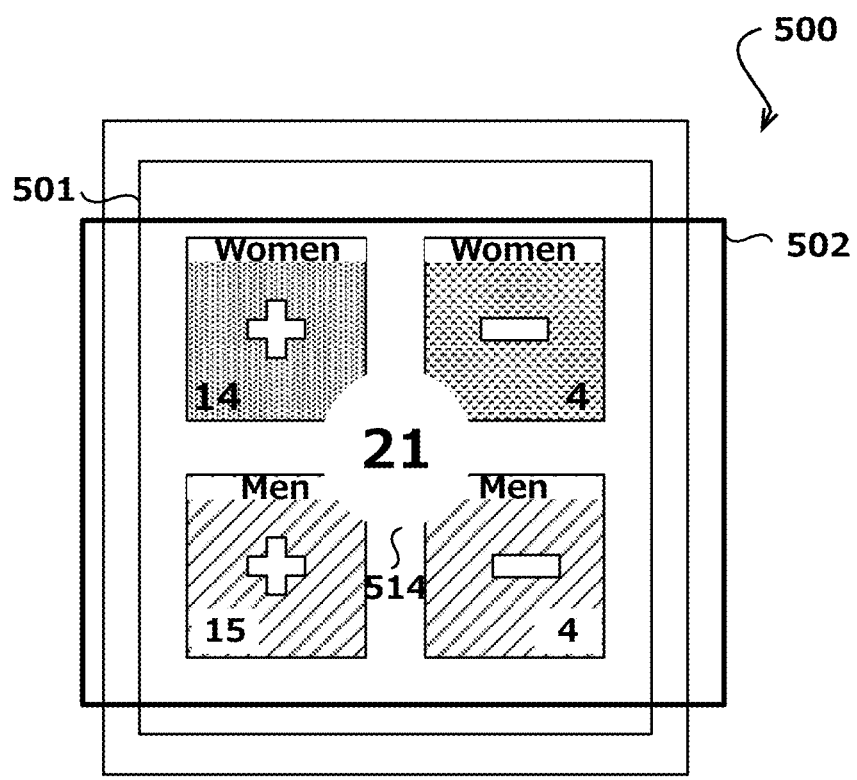
FIGS. 5A, 5B, and 5C illustrate example interfaces for collaborative counting in accordance with various embodiments.
Figure 5B:
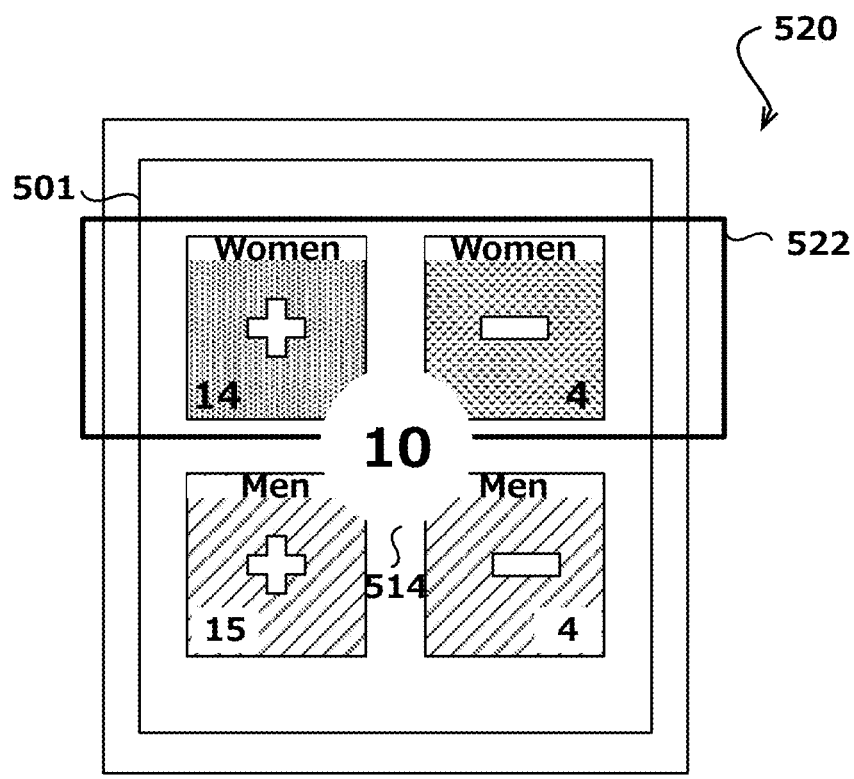
Figure 5C:
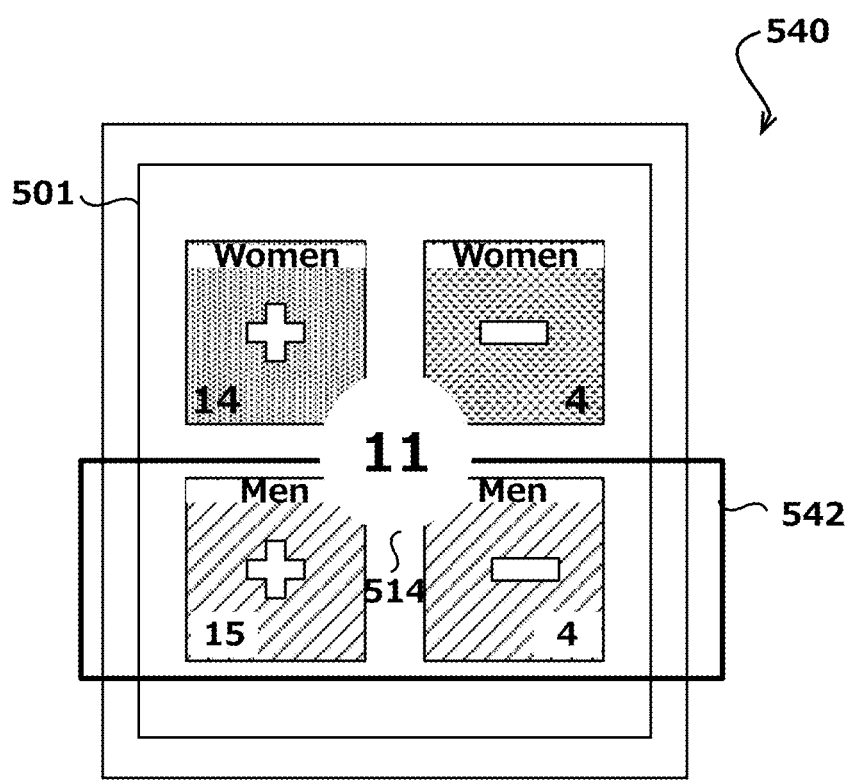

FIG. 5A illustrates example 500 of changing the category for which the total category count corresponds in accordance with various embodiments. In this example, total count 514 corresponds to an absolute total count, which represents the total number of increments for the categories less the total number of decrements for the categories. For example, in the situation the category count for women is 14, the category count for men is 15, the decrement count for women is 4, and the decrement count for men is 4, the absolute total count displayed is 21. Interface 501 in various embodiments may visually emphasize that total count 514 corresponds to the absolute total count with bounding box 502. FIG. 5B illustrates example 520, where total count 514 corresponds to a total category count for the category of women, where the total category count displayed is 10. Interface 501 in various embodiments may visually emphasize that total count 514 corresponds to the category of women with bounding box 522. A user may change the category for which the total category count corresponds via a gesture-based input (e.g., double-tap, swipe, etc.) on interface 501, software customization setting, voice-based input, air gesture-based input, etc. In this example, in response to a touch-based input or other such input, total category count 514 corresponding to the category of women is changed to the category of men, as illustrated in example 540 of FIG. 5C. In this example, total category count 514 can display a count of 11. To emphasize the selected category, in this example the category of men, bounding box 542 can include the virtual input buttons corresponding the category of men. In the situation total count 514 corresponds to an absolute total count, a bounding box or other such visualization can be placed around the virtual input button sets for the displayed categories. It should be noted that other visual effects may be utilized, including, for example, highlights, shadows, color, animation, text, visual cues (e.g., arrows, lines, etc.), and the like.

Figure 6:
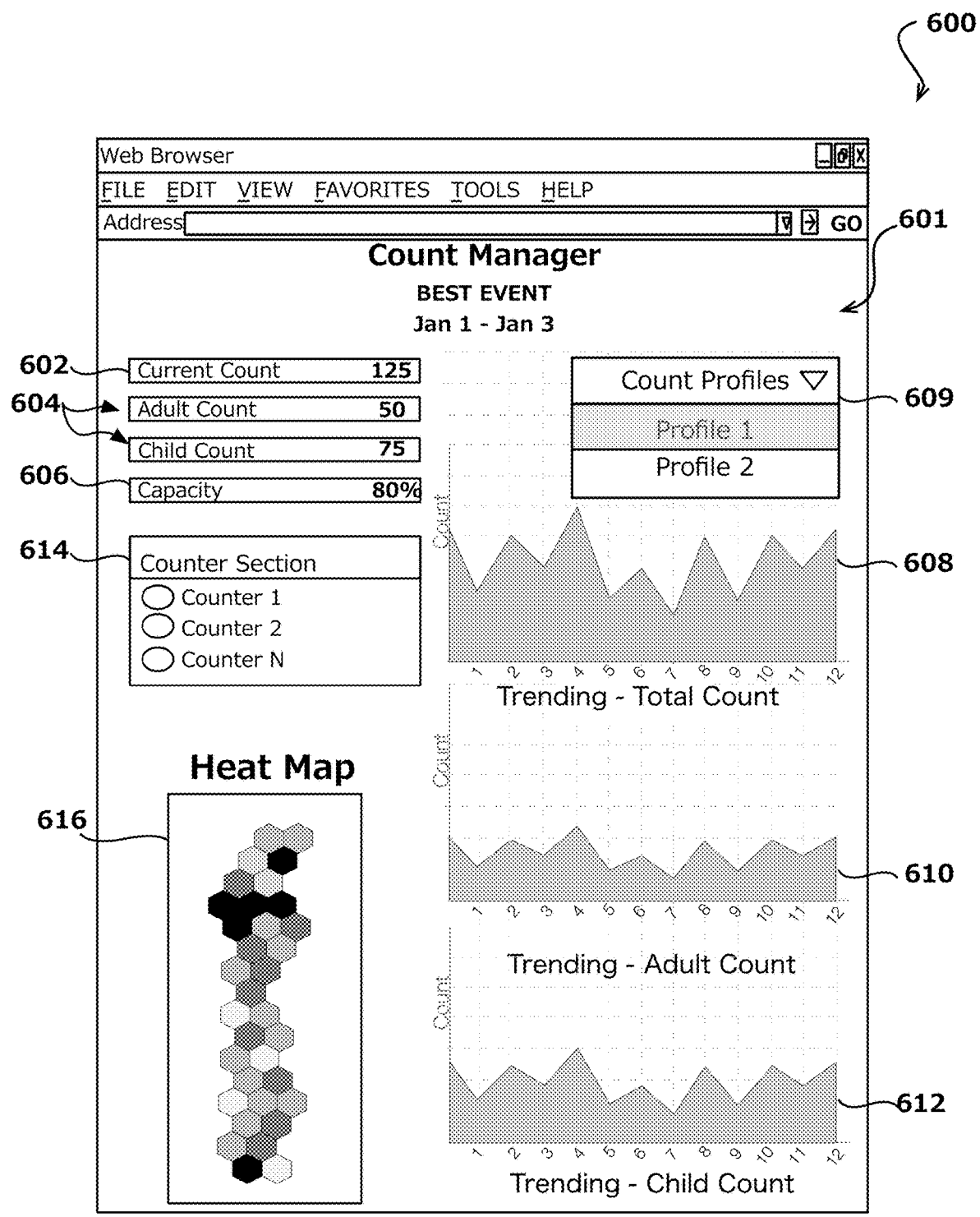
FIG. 6 illustrates an example of an interface which provides information associated one or more connected counting devices in accordance with various embodiments.

Example 600 of FIG. 6 illustrates an example interface that provides information associated with one or more connected counting devices in accordance with various embodiments. In this example, an appropriate person, for example, a business owner may use interface 601 to access and manage an account related to a plurality of connected counting devices using, e.g., a web browser, software application, mobile device application, etc. Additionally, or alternatively, the person can use interface 601 to manage one or more connected counting devices by providing configuration information that, when processed by a device, can configure one or more sets of input buttons for counting one or more categories, indicate an account for providing counting and other data, the categories for counting, a location for counting (e.g., gate, entrance, exit), etc. Interface 601 can be provided by a service provider providing collaborative counting systems.

The user can log in to interface 601 via an appropriate log in screen. Once the user's credentials are validated, interface 601 can display a dashboard that can be configured to display content, including, for example, counts and associated qualifying information, counting profiles 609, graphs of counts and other data, tables of graphs and other data, correlations between data sets, business settings, business location, date of counting, location of counters, a list of events for an event customer or a list of locations for other customer types, etc. In an embodiment, the types of information displayed, the order and/or arrangement, can be user-defined and updated, and/or determined by the service provider, or a combination thereof.

As shown in FIG. 6, interface 601 includes a display of a summary of absolute count 602, one or more total category counts 604, capacity utilized 606, and the like. The summary can be for a particular event for a specific time frame, for one or more counting devices. The user can select between events, change the time frame, view data for particular devices, etc.

Interface 601 can display absolute and category count graphs. In various embodiments, the graphs may show the number of counts over a period of time, update in real-time, provide a scrollable/zoomable timeline, etc. As shown, graph 608 represents the absolute total count for the available categories. Graphs 610 and 612 represent individual total category counts.

Counter selection pane 614 allows a user to select one or more counters, where the count for the selected counters can contribute to the information shown on the interface. The counters may be assigned to particular locations, categories, etc. A counting profile may be used in certain embodiments to select a set of counters to display information (e.g., charts, tables, graphs) for those counters.

In certain embodiments, additional information or graphs may be utilized to illustrate count information and/or related information. For example, heat graph 616 may be utilized to illustrate periods of time associated with a high-count number. In another example, qualifying information associated count data can be displayed to illustrate a correlation with, e.g., sales, demographic, and other qualifying information, to provide information related to qualitative and quantitative reporting.

Interface 601 can be configured to display information based on report criteria (e.g., filters and the like) selected by users of the information. In various embodiments, users can select from a list of counting profiles and apply date filters and other such filters to control the presentation of information, including, for example, creating custom dashboards per the counting profiles and other selections. In an example, charts or tables can be used to show high/low count periods of time in a day, week, month, year, etc.; high/low count entrances/exists; average change in count data, velocity of change of count data, etc.

The interface can be updated in real-time to reflect current counting data from one or more connected counting devices. One or more alerts can be presented based on a user's notification settings and/or thresholds. In certain embodiments, a user can select a present data feed of counts and associated count information. In yet another example, the count and associated information can be used to enable count-based automated promotions through traditional channels and social networks. The system can create analytics and charts from the counts in real-time to add contextual information and insights to the counts and improve decision making.

In accordance with various embodiments, a user can associate information for events, add text, audio, or video messages, add a label to data indicating a location (e.g., gate, entrance, exit) where count information is obtained. For example, a counting device can be associated with a gate, entrances, exit, etc.; and interface 601 can be used to label data for a counting device for a specific location. In various embodiments, a counting device can provide location information to a collaborative counting system providing interface 601, and the location information can be used to verify the location of the device as indicated via interface 601. In the situation where the location information (e.g., GPS information) of the device does not match the location as indicated by interface 601 or otherwise stored by the collaborative counting system, an alert can be triggered and provided to the appropriate person.

In an embodiment, a user can use interface 601 to create rules for a management application to trigger relevant messages for different attendance and event situations. The management application may connect with other databases, as defined by the user, and pull (e.g., transfer or copy) relevant data (e.g., sales data) into the central database. The management application can combine different data sets to create comprehensive reports on traffic, sales, conversion, and sales trends based on attendance demographics, other data sets, or any combination thereof. The management application can also dynamically generate promotional messages based on system rules defined by the user. The management application can provide configuration information to the counting devices. Counts, promotional messages, data, or reports can be published through any display means, such as print or website or phone applications. They can also be reported via Facebook, Twitter, and Other Social Networking Accounts of the user.

It should be noted that interface 601 can include other sections and/or be used to display other information using panels, graphs, charts, tables, widgets as is known in the art, and the embodiments illustrated are merely examples of such information. For example, the user can select an event to see total count information for the event for a specified time period, a list of counting locations (e.g., entrances, exists, etc.) at the event where counts were tracked, last update time and place, summary trends for the event, etc. In another example, the user can change the date to select other dates or a range of dates as well as change the counting profile to view other summaries. In yet another example, interface 601 allows a user to select a location to be presented details for that location. The location detail page can show summary counts, count distribution per hour, split of counts per device used at the location (e.g., gate 1, gate 2, etc.), average time spent per counter type (e.g., men, women, etc.), and average counts per day of the week and hour of the day which can be used by bars, retailer stores, and other businesses to forecast staffing, ordering supplies, etc. In yet another example, interface 601 provides an admin section where a user can perform various admin functions such as adding, deleting, or modifying users, counting devices, locations, counting profiles, count data, media such as image data, video data, audio data; making payments; updating billing; redesigning devices; etc.

Figure 7:
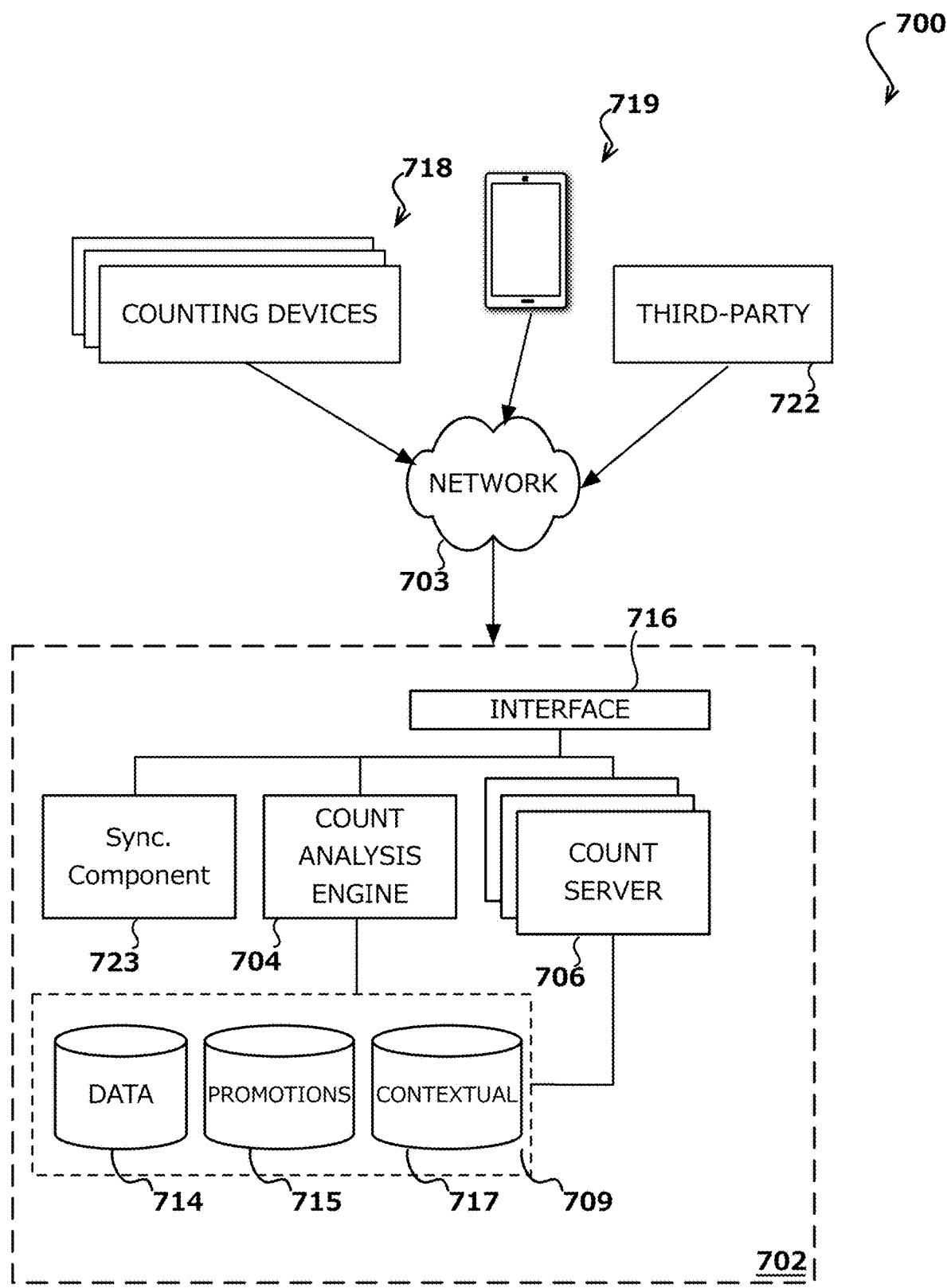
FIG. 7 illustrates a block diagram of components of a collaborative counting system in accordance with various embodiments.

FIG. 7 illustrates a block diagram 700 of components of a collaborative counting system in accordance with various embodiments. In this example, a collaborative counting system 702 includes count analysis engine 704 and content server 706. Collaborative counting system 702 may also include one or more data stores 709, including, for example, data store 714, promotional data store 715, and contextual data store 717. It should be noted that although the data stores are shown as separate data stores, data from the data stores can be maintained across fewer or additional data stores. The data stores can be accessed by count analysis engine 704, and content server 706 to obtain information in order to perform the functionality of the corresponding component. Although collaborative counting system 702 is shown as a single system, the collaborative counting system 702 may be hosted on multiple server computers and/or distributed across multiple systems. Additionally, the components may be performed by any number of different computers and/or systems. Thus, the components may be separated into multiple services and/or over multiple different systems to perform the functionality described herein.

In this example, a plurality of connected counting devices 718 can provide count and other data to collaborative counting system 702. The plurality of connected counting devices can include dedicated counting devices, mobile devices with appropriating counting software applications, etc. In certain embodiments, the plurality of connected counting devices includes an integrated Microcontroller with WiFi, Bluetooth, 3G, and GPS Modules, display and touch screen, physical video gaming style buttons, camera(s), microphone(s) and speaker(s), an operating system (e.g., Android) and App (e.g., a custom app), power module & battery, walkie talkie component, flashlight module, software engine, database/repository, Web & Phone Apps. The various components may be implemented on multiple components and/or distributed across multiple components. Additionally, the components may be implemented using any number of different computers and/or systems. Thus, the components may be separated into multiple services and/or over multiple different systems to perform the functionality described herein. It should be appreciated that alternate embodiments may have numerous variations from that described above. For example, customized hardware might also be used, and/or particular elements might be implemented in hardware, software (including portable software, such as applets) or both. Further, connection to other computing devices such as network input/output devices may be employed.

The plurality of connected counting devices can include counting software applications that allow a user of such a device to configure how many categories of objects and what those categories are. In certain embodiments, configuration information such as a configuration file can be used to configure the devices. The configuration information includes instructions that, when processed by the device, can configure one or more sets of input buttons for counting one or more categories, indicate an account for providing counting and other data, the categories for counting, a location for counting (e.g., gate, entrance, exit), etc. The counting application can transfer data to collaborative counting system 702 across at least one network 703 using Wi Fi, Cellular, or Bluetooth technology. The application can provide access to a camera and microphone to provide pictorial, video, and audio qualification on the counts. The camera can also be used to scan identification cards, QR codes, or take pictures of badges. In addition, the application has other features like walkie talkie and flashlight.

The connected counting devices or computing devices having an appropriate application operating thereon can provide count data for one or more categories across at least one network 703. The data can be sent at pre-defined or configurable intervals, on-demand when initiated by a user or another device, in response to satisfying one or more threshold (e.g., a count threshold, a time threshold, etc.) In the situation the connected counting device is not connected an appropriate network, e.g., wifi, mobile data, etc., the data can be stored on the connected counting device and transmitted at an appropriate time. In an example, the data can be sent when the connected counting device connects to a network or in accordance with an approach described herein.

The count and other data can be received by network interface layer 716 via network 703. In an embodiment, the at least one network 703 can include any appropriate network, such as may include the Internet, an Intranet, a local area network (LAN), a cellular network, a Wi-Fi network, and the like. In any situation, the count and other data can be sent to an appropriate provider environment that includes collaborative counting system 702.

Interface 716 may include any software and/or hardware components configured to send and receive communications and/or other information between collaborative counting system 702, connected counting devices 718, and third-party 722 (e.g., business entities). In various embodiments, interface 716 may include a data interface and service interface and may be configured to periodically receive data sets, requests, and/or any other relevant information to facilitate real-time counting and display of such information. Interface 716 can include any appropriate components known or used to receive requests or other data from across a network, such as may include one or more application programming interfaces (APIs) or other such interfaces for receiving such requests and/or data. Interface 716 might be owned and operated by a provider, or leveraged by a provider as part of a shared resource or "cloud" offering.

Once the count data or other data is received at interface 716, the data can be analyzed, and at least a portion of the data can be directed to an appropriate system or service, such as count analysis engine 704 (e.g., a Web server or application server), listener application or component, among other such options. For example, count analysis engine 704 can receive data from a plurality of counting applications. The data (e.g., counts, images, audio, video, scanned data, etc.) can be stored in data store 714, for example, or other appropriate data stores. In an embodiment, the data can be analyzed to determine any missed counts. For example, count analysis engine 704 can use at least one image processing technique to analyze image data, scan data, and determine whether a count should have been logged, and if not, create count data. Count analysis engine 704 is further operable to process the data to generate attendee lists and provide automated counts, and analyze the counts to create charts, graphs, trends, and the like. In certain embodiments, count analysis engine 704 or other such component of service can create analytics and charts from the counts in real-time to add contextual information and insights from contextual data store 717 to the counts, which can be used to improve business decision making.

In the case of presenting real-time count information, for example, count analysis engine 704 can interact with other components such as count server 706 to cause to be displayed counts and associated qualifying information through one or more connected counters 718, mobile devices 719, and/or web applications, etc. This can include, for example, directing information to at least one other server for processing to associate counts with qualifying information. In this example, the servers or other components of the environment might access one or more data stores, such as count data store 714 that contains count information for a plurality of connected devices, promotional data store 715 that contains additional content that may be presented with the count data, and contextual data store that contains qualifying information. The qualifying information can then be used to associate count data with, e.g., sales, demographic, and other qualifying data sources, to provide information related to qualitative and quantitative reporting. In certain embodiments, the count and associated information can be used to enable count-based automated promotions from promotions data store 715 through traditional channels and social networks as provided by one or more third-parties 722.

In accordance with various embodiments, third-parties 722 may subscribe, download, or otherwise access count data and associated qualifying information for a number of purposes. For example, a business may access the data to assist in staff scheduling, business hour operation scheduling, marketing, social networking, etc. In an embodiment, the data may be used to supplement various third-party applications that, for example, provide user-rated listings of businesses or business listing based on check-ins, friends' recommendations, etc. In an example, the data may be used to identify popular locations (e.g., location with a high-volume of increment and decrement counts), busy locations (e.g., locations with a high number of increment counts), etc.

Synchronization component 723 is operable to synchronize counts and other data between the plurality of connected devices and/or software operating on connected devices, servers, or services to maintain accurate counts without relying on manual counting approaches. Thereafter, a user interface, application, connected counting device, mobile device (e.g., headset, smart glasses, goggles, smartwatch, etc.), and the like can be used to view and interact with the processed count and other data.

Although collaborative counting system 702 is shown in a single system, the system 702 may be hosted on multiple server computers and/or distributed across multiple systems. Additionally, the components may be performed by any number of different computers and/or systems. Thus, the components may be separated into multiple services and/or over multiple different systems to perform the functionality described herein.

In this use case, bars use tally counters for fire compliance. Counts are manually saved at best for business performance analysis. Tally counters used at multiple doors do not sync, so the accuracy of occupancy is questionable. Connected counting devices solve these problems as counts are saved automatically, devices sync in real-time, and information is available for analysis by owners/managers.

Such a system can be utilized in a number of use cases. For example, churches use tally counters to track ebbs and flows, age demographics, gender-mix, race mix, new vs. old members, etc. and manually load the information to a computer for future analysis. A plurality of connected counters in accordance with the embodiments described herein can automate the process when counts are captured with it.

In another example, greeters at retail stores use tally counters to count incoming guests for proper staffing, planning optimal checkout registers, and product planning. Store managers get count info periodically to make real-time decisions. At the end of the day, the counts are uploaded to a central system for traffic analysis. A plurality of connected counters can in accordance with the embodiments described herein can provide real-time information via apps to the store managers and analyze the counts automatically.

In yet another example, attendants at museums count visitors to different exhibits to assess popularity and interest in the exhibits. A plurality of connected counters in accordance with embodiments described herein can provide a comprehensive dashboard for hourly/daily/weekly/monthly analysis.

In yet another example, prison guards use tally counters to track the count of inmates at every section. The sum total of inmates at all sections should tally with the total inmate population. A plurality of connected counters in accordance with embodiments described herein can automate the tallying aspect and provide alerts as needed.

In yet another example, free events that do not have RFID or Badges with QR codes use tally counters for attendance and hourly distribution of guests. A plurality of connected counters in accordance with embodiments described herein can provide a high-quality dashboard as if the event used RFID/QR tags.

Figure 8:
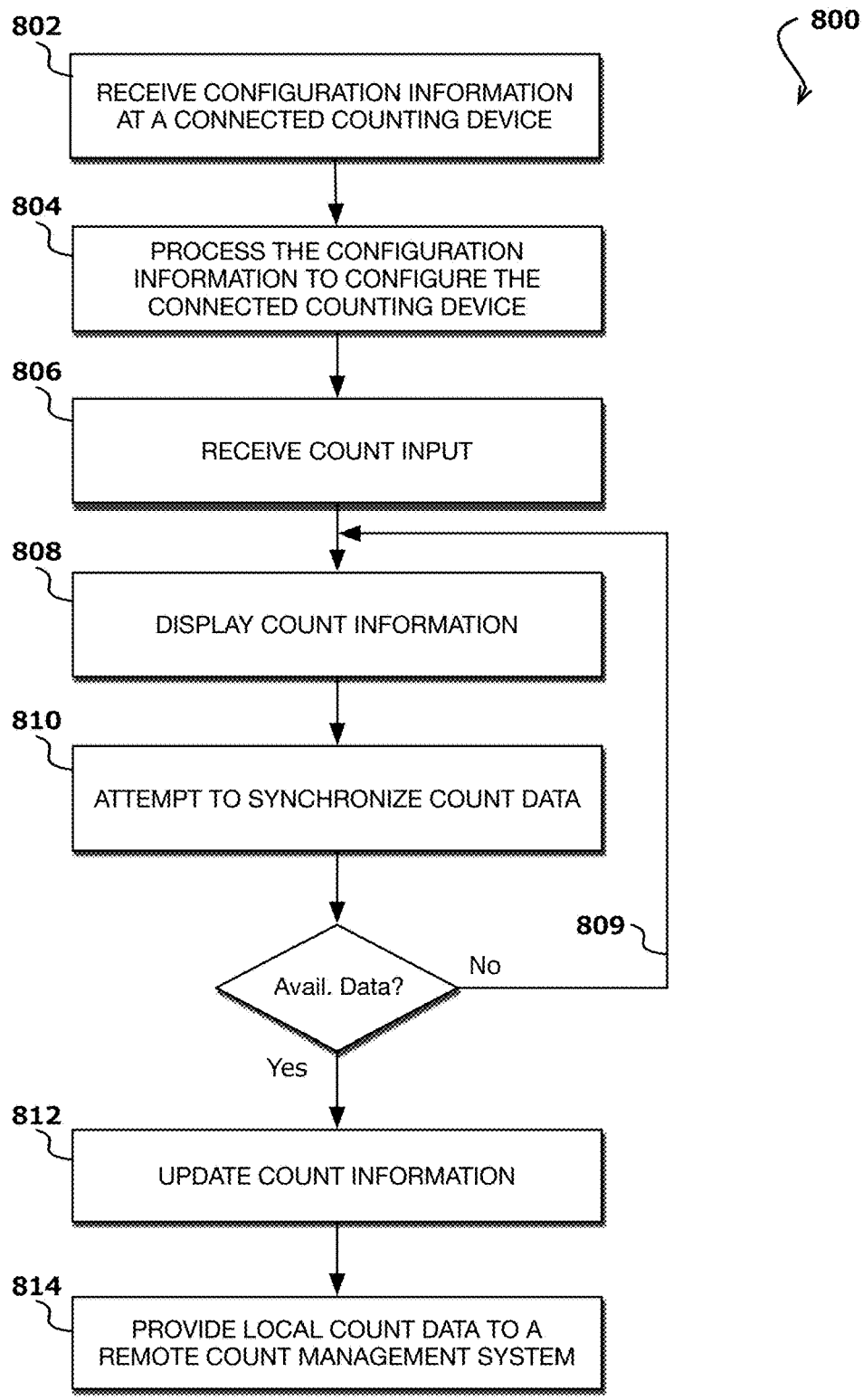
FIG. 8 illustrates an example process for configuring a connected counting device in accordance with various embodiments.

FIG. 8 illustrates an example process 800 for configuring a connected counting device in accordance with various embodiments. It should be understood that, for any process discussed herein, there can be additional, fewer, or alternative steps performed in similar or alternative orders, or in parallel, within the scope of the various embodiments unless otherwise stated. In an example, configuration information is received 802 at a connected counting device. The connected counting device can include dedicated counting devices, mobile devices with appropriating counting software applications, etc.

The configuration information can be generated or modified at a management interface provided by a count management system. In an example, a user can change the device configuration by assigning a new counting profile using the management interface, moving the device to a new location which can trigger a counting profile for the location, updating a device label from the available options at the management interface for the registered user among other such options.

The configuration information is processed 804 to configure the counting device. In an example, the configuration information can include instructions that, when processed by the device, can configure one or more sets of input buttons for counting one or more categories, indicate an account for providing counting and other data, the categories for counting, a location for counting (e.g., gate, entrance, exit), etc. For example, each set of buttons (e.g., an increment button and a decrement button) can be assigned to particular counting category, the display screen can be configured to show particular count information, along with an indication of the account owner and information for a location to count.

Count input is received 806 at the device. This can include, for example, a press of an increment or decrement button, or a press of virtual button in certain embodiments, count data received from a central data base or connected counting device, etc.

In response to the input, a display element on the device can display 808 count information. For example, the display element can display a total count, which can correspond to the number of times the increment buttons are pressed minus the number of times the decrement buttons are pressed. In at least some embodiments, information that may be particularly relevant can include a rate at which the total count is increasing or decreasing, a count for different objects (e.g., a count or adults and a count for children), battery information, network connection strength, total number of counters for a counting session, etc.

The device can attempt to synchronize 810 count data from other connected counting devices registered to a user account, devices at a particular location, devices associated with the same counting profile, or combination thereof. For example, count data from a plurality of connected counting devices can be stored to a central database and the device can attempt to obtain count data from the central database. In another example, the device can obtain count data directly from connected counting devices. In the situation count data is available, the display element on the device can update 812 to reflect synchronized count data. In the situation count data is not available, the device can continue monitoring 809 for count data from other connected counting devices.

The device can provide 814 local count data to a remote count management system or other such system or service when the device is connected to the internet, mobile data network, etc. (i.e., online). The data can be provided at pre-defined or configurable intervals, on-demand when initiated by a user or another device, in response to satisfying one or more threshold (e.g., a count threshold, a time threshold, etc.) Additionally, in the situation a dashboard in accordance with embodiments described herein, is being displayed, count data displayed on the dashboard can be updated. In the situation the device is not connected to the internet, mobile data network, etc. (i.e., offline), the count data can be stored on local memory until an appropriate time, such as when the device connects to the internet or mobile network. In various embodiments, a user can edit the last count, all counts for the day, or all counts within a certain time frame. In the situation the count is updated, the updated count data can be provided to the remote count management system and count data for connected counters can be updated accordingly.

In certain embodiments, the device may be able to establish a peer-to-peer connection or direct connection (e.g., via Bluetooth, NFC, etc.) with a second connected counting device (or a plurality of connected counting devices) that is unable to transmit count data because, for example, the second connected counting device does not have an internet or mobile data connection. In this situation, the second connected counting device can transmit count data to any appropriate connected counting device so that the receiving device can transmit the count data to the remote count management system. Thereafter, the count data can be provided to appropriate connected counting devices, where an appropriate connected counting device includes devices registered to the same user account, devices at a particular location, devices associated with the same counting profile, a device otherwise authorized to receive count data from one or more specified connected counting devices, or combination thereof.

Figure 9:
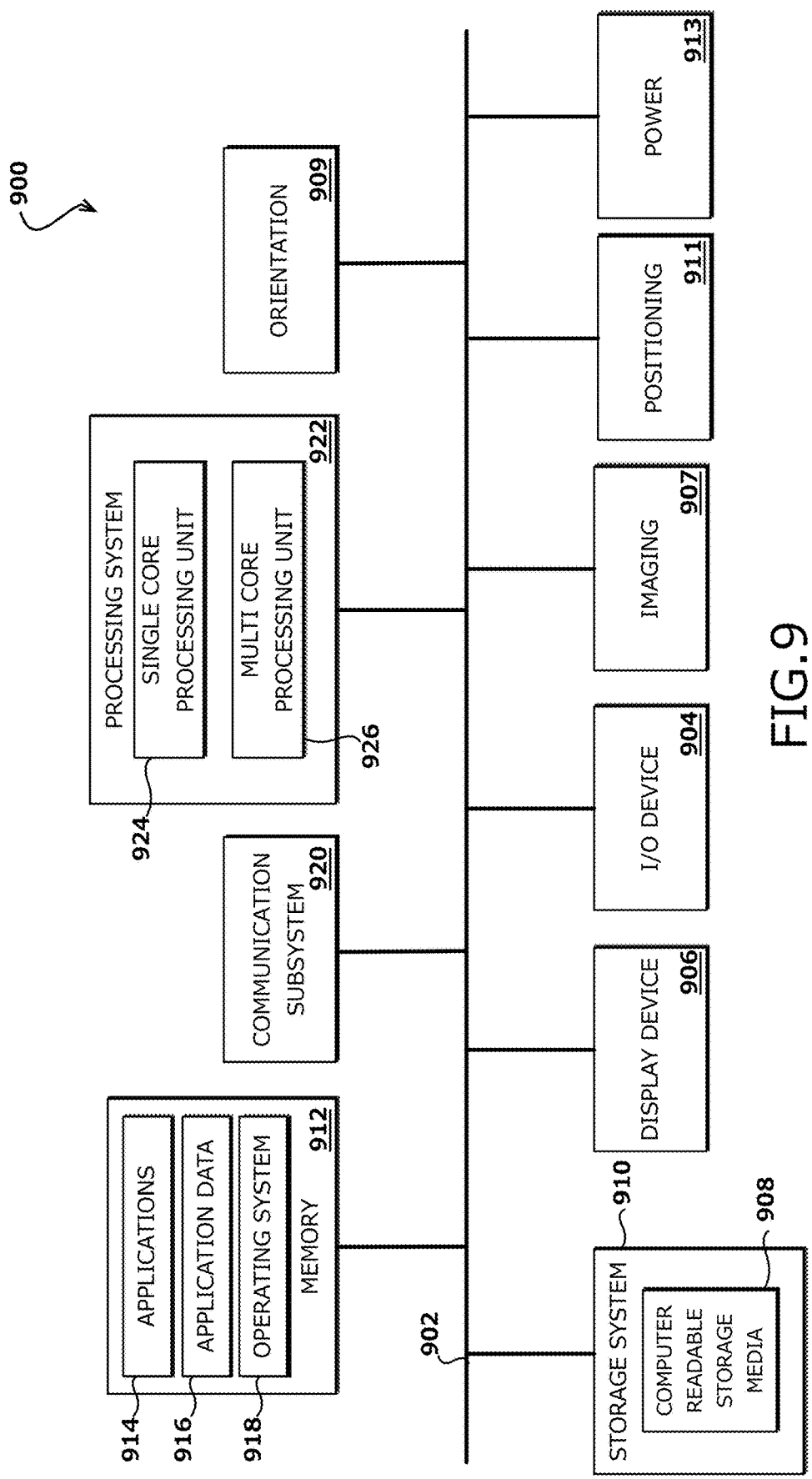
FIG. 9 illustrates an example configuration of components of a device such as a census counter in accordance with an embodiment.

FIG. 9 illustrates a set of basic components of an electronic computing device such as counting device 102 described with respect to FIG. 1A. In this example, computer system 900 may be used in various embodiments to implement any of the systems, devices, or methods described herein. In some embodiments, computer system 900 may correspond to any of the various devices described herein, including, but not limited, to connected counting devices, mobile devices, tablet computing devices, wearable devices, personal or laptop computers, vehicle-based computing devices, or other devices or systems described herein. As shown in FIG. 9, computer system 900 can include various subsystems connected by a bus 902. The subsystems may include an I/O device subsystem 904, a display device subsystem 906, and a storage subsystem 910 including one or more computer-readable storage media 908. The subsystems may also include a memory subsystem 912, a communication subsystem 920, and a processing subsystem 922.

In system 900, bus 902 facilitates communication between the various subsystems. Although a single bus 902 is shown, alternative bus configurations may also be used. Bus 902 may include any bus or other components to facilitate such communication as is known to one of ordinary skill in the art. Examples of such bus systems may include a local bus, parallel bus, serial bus, bus network, and/or multiple bus systems coordinated by a bus controller. Bus 902 may include one or more buses implementing various standards such as Parallel ATA, serial ATA, Industry Standard Architecture (ISA) bus, Extended ISA (EISA) bus, MicroChannel Architecture (MCA) bus, Peripheral Component Interconnect (PCI) bus, or any other architecture or standard as is known in the art.

In some embodiments, I/O device subsystem 904 may include various input and/or output devices or interfaces for communicating with such devices. Such devices may include, without limitation, a touch screen or other touch-sensitive input device, a keyboard, a mouse, a trackball, a motion sensor or other movement-based gesture recognition device, a scroll wheel, a click wheel, a dial, a button, a switch, audio recognition devices configured to receive voice commands, microphones, image capture based devices such as eye activity monitors configured to recognize commands based on eye movement or blinking, and other types of input devices. I/O device subsystem 904 may also include identification or authentication devices, such as fingerprint scanners, voiceprint scanners, iris scanners, or other biometric sensors or detectors. In various embodiments, I/O device subsystem may include audio output devices, such as speakers, media players, or other output devices. These I/O devices could even be connected by a wireless infrared or Bluetooth or other link as well in some embodiments. Some devices also can include a microphone or other audio capture element that accepts voice or other audio commands. For example, a device might not include any buttons at all, but might be controlled only through a combination of visual and audio commands, such that a user can control the device without having to be in contact with the device.

Computer system 900 may include a display device subsystem 906. Display device subsystem may include one or more lights, such as one or more light emitting diodes (LEDs), LED arrays, a liquid crystal display (LCD) or plasma display or other flat-screen display, a touch screen, a head-mounted display or other wearable display device, a projection device, a cathode ray tube (CRT), and any other display technology configured to visually convey information. In various embodiments, display device subsystem 906 may include a controller and/or interface for controlling and/or communicating with an external display, such as any of the above-mentioned display technologies.

As shown in FIG. 9, system 900 may include storage subsystem 910 including various computer-readable storage media 908, such as hard disk drives, solid-state drives (including RAM-based and/or flash-based SSDs), or other storage devices. In various embodiments, computer-readable storage media 908 can be configured to store software, including programs, code, or other instructions, that is executable by a processor to provide the functionality described herein. In some embodiments, storage system 910 may include various data stores or repositories or interface with various data stores or repositories that store data used with embodiments described herein. Such data stores may include, databases, object storage systems and services, data lakes or other data warehouse services or systems, distributed data stores, cloud-based storage systems and services, file systems, and any other data storage system or service. In some embodiments, storage system 910 can include a media reader, card reader, or other storage interfaces to communicate with one or more external and/or removable storage devices. In various embodiments, computer-readable storage media 908 can include any appropriate storage medium or combination of storage media. For example, computer-readable storage media 908 can include, but is not limited to, any one or more of random-access memory (RAM), read-only memory (ROM), electronically erasable programmable ROM (EEPROM), flash memory or other memory technology, optical storage (e.g., CD-ROM, digital versatile disk (DVD), Blu-ray® disk or other optical storage device), magnetic storage (e.g., tape drives, cassettes, magnetic disk storage or other magnetic storage devices). In some embodiments, computer-readable storage media can include data signals or any other medium through which data can be transmitted and/or received.

Memory subsystem 912 can include various types of memory, including RAM, ROM, flash memory, or other memory. Memory 912 can include SRAM (static RAM) or DRAM (dynamic RAM). In some embodiments, memory 912 can include a BIOS (basic input/output system) or other firmware configured to manage initialization of various components during, e.g., startup. As shown in FIG. 9, memory 912 can include applications 914 and application data 916. Applications 914 may include programs, code, or other instructions, that can be executed by a processor. Applications 914 can include various applications such as browser clients, campaign management applications, data management applications, and any other application. Application data 916 can include any data produced and/or consumed by applications 914. Memory 912 can additionally include operating system 918, such as macOS®, Windows®, Linux®, various UNIX® or UNIX- or Linux-based operating systems, or other operating systems.

System 900 can also include a communication subsystem 920 configured to facilitate communication between system 900 and various external computer systems and/or networks (such as the Internet, a local area network (LAN), a wide area network (WAN), a mobile network, or any other network). Communication subsystem 920 can include hardware and/or software to enable communication over various wired (such as Ethernet or other wired communication technology) or wireless communication channels, such as radio transceivers to facilitate communication over wireless networks, mobile or cellular voice and/or data networks, WiFi networks, or other wireless communication networks such as Bluetooth, cellular, NFC, or Wi-Fi channels. In some embodiments, communication subsystem 920 may include, or interface with, various hardware or software sensors. The sensors may be configured to provide continuous or and/or periodic data or data streams to a computer system through communication subsystem 920.

System 900 can also include at least one imaging element 907, such as one or more cameras that are able to capture images of the surrounding environment and that are able to image a user, people, or objects in the vicinity of the device. The image capture element can include any appropriate technology, such as a CCD image capture element having a sufficient resolution, focal range, and viewable area to capture an image of the user when the user is operating the device. Methods for capturing images using a camera element with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device.

System 900 also includes at least one orientation determining element 909 able to determine and/or detect orientation and/or movement of the device. Such an element can include, for example, an accelerometer or gyroscope operable to detect movement (e.g., rotational movement, angular displacement, tilt, position, orientation, motion along a non-linear path, etc.) of system 900. An orientation determining element can also include an electronic or digital compass, which can indicate a direction (e.g., north or south) in which the device is determined to be pointing (e.g., with respect to a primary axis or other such aspect).

The system in many embodiments will include at least a positioning element 911 for determining a location of the device (or the user of the device). A positioning element can include or comprise a GPS or similar location-determining elements operable to determine relative coordinates for a position of the device. As mentioned above, positioning elements may include wireless access points, base stations, etc., that may either broadcast location information or enable triangulation of signals to determine the location of the device. Other positioning elements may include QR codes, barcodes, RFID tags, NFC tags, etc., that enable the device to detect and receive location information or identifiers that enable the device to obtain the location information (e.g., by mapping the identifiers to a corresponding location). Various embodiments can include one or more such elements in any appropriate combination.

Some embodiments use the element(s) to track the location of a device. Upon determining an initial position of a device (e.g., using GPS), the device of some embodiments may keep track of the location of the device by using the element(s), or in some instances, by using the orientation determining element(s) as mentioned above, or a combination thereof. As should be understood, the algorithms or mechanisms used for determining a position and/or orientation can depend at least in part upon the selection of elements available to the device.

The system also includes a power system 913, such as may include a battery operable to be recharged through conventional plug-in approaches, or through other approaches such as capacitive charging through proximity with a power mat or other such device. Various other elements and/or combinations are possible as well within the scope of various embodiments.

As shown in FIG. 9, processing system 922 can include one or more processors or other devices operable to control computing system 900. Such processors can include single-core processors 924, multi-core processors, which can include central processing units (CPUs), graphical processing units (GPUs), application specific integrated circuits (ASICs), digital signal processors (DSPs) or any other generalized or specialized microprocessor or integrated circuit. Various processors within processing system 922, such as processors 924 and 926, may be used independently or in combination depending on the application.

Various other configurations may also be used, with particular elements that are depicted as being implemented in hardware may instead be implemented in software, firmware, or a combination thereof. One of ordinary skill in the art will recognize various alternatives to the specific embodiments described herein.

The various embodiments can be implemented in a wide variety of operating environments, which in some cases can include one or more user computers or computing devices which can be used to operate any of a number of applications. User or client devices can include any of a number of general-purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, FTP, UPnP, NFS, and CIFS. The network can be, for example, a local area network, a wide-area network, a virtual private network, the internet, an intranet, an extranet, a public switched telephone network, an infrared network, a wireless network and any combination thereof.

In embodiments utilizing a web server, the web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random-access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or web browser. It should be appreciated that alternate embodiments may have numerous variations from that described above. For example, customized hardware might also be used, and/or particular elements might be implemented in hardware, software (including portable software, such as applets) or both. Further, connection to other computing devices such as network input/output devices may be employed.

Storage media and other non-transitory computer-readable media for containing code, or portions of code, can include any appropriate media known or used in the art, including storage media and communication media, such as but not limited to volatile and non-volatile, removable and non-removable media implemented in any method or technology for storage of information such as computer-readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

The methods, systems, and devices discussed above are described with reference to block diagrams and/or operational illustrations of methods, systems, and computer program products according to embodiments of the present disclosure. The functions/acts noted in the blocks may occur out of the order as shown in any flowchart. For example, two blocks shown in succession may in fact be executed substantially concurrent or the blocks may sometimes be executed in the reverse order, depending upon the functionality/acts involved. Additionally, or alternatively, not all of the blocks shown in any flowchart need to be performed and/or executed. For example, if a given flowchart has five blocks containing functions/acts, it may be the case that only three of the five blocks are performed and/or executed. In this example, any of the three of the five blocks may be performed and/or executed.

Specific details are given in the description to provide a thorough understanding of example configurations (including implementations). However, configurations may be practiced without these specific details. For example, well-known circuits, processes, algorithms, structures, and techniques have been shown without unnecessary detail to avoid obscuring the configurations. This description provides example configurations only, and does not limit the scope, applicability, or configurations of the claims. Rather, the above description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of various implementations or techniques of the present disclosure. Also, a number of steps may be undertaken before, during, or after the above elements are considered.

Reference in the specification to "one embodiment" or to "an embodiment" means that a particular feature, structure, or characteristic described in connection with the embodiments is included in at least one example implementation or technique in accordance with the present disclosure. The appearances of the phrase "in one embodiment" in various places in the specification are not necessarily all referring to the same embodiment.

Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices. Portions of the present disclosure include processes and instructions that may be embodied in software, firmware or hardware, and when embodied in software, may be downloaded to reside on and be operated from different platforms used by a variety of operating systems.

In addition, the language used in the specification has been principally selected for readability and instructional purposes and may not have been selected to delineate or circumscribe the disclosed subject matter. Accordingly, the present disclosure is intended to be illustrative, and not limiting, of the scope of the concepts discussed herein.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Having been provided with the description and illustration of the present application, one skilled in the art may envision variations, modifications, and alternate embodiments falling within the general inventive concept discussed in this application that do not depart from the scope of the claims.

What is claimed is:

1. A counting device, comprising:
    a housing having a front portion, a back portion, a top portion, and a bottom portion, the bottom portion having a grip section that includes a through-hole sized for at least one finger to pass through, the housing having an ergonomic shape that is quantified based on a biomechanical neutral position;
    a controller comprising a set of input buttons an increment button operable to increment a count and a decrement button operable to decrement the count;
    a display screen configured to display at least one of a total count or an absolute count based on user input at a plurality of counting devices; and
    a memory device including instructions that, when executed by the counting device, enables the counting device to:
        receive configuration information,
        analyze the configuration information to associate the set of input buttons with a category,
        receive a user selection of one of the set of input buttons, and
        provide the user selection to a remote computing device for processing.

2. The counting device of claim 1, wherein the biomechanical neutral position is based on an alignment of bodily features satisfying a threshold degree of alignment.

3. The counting device of claim 2, wherein the alignment of the bodily features is between a first target area of a first bodily feature and a second target area of a second bodily feature.

4. The counting device of claim 3, wherein the first bodily feature corresponds to a radius bone and the second bodily feature corresponds to a proximal interphalangeal joint of an index finger of a user.

5. The counting device of claim 1, wherein the bottom portion forms a comfortable naturally extended grip surface.

6. The counting device of claim 1, wherein the biomechanical neutral position allows a user to contact the set of input buttons without changing a grasp on the counting device.

7. The counting device of claim 1, further comprising:
    a second set of input buttons, the second set of input buttons including a second increment button and a second decrement button.

8. The counting device of claim 7, wherein the set of input buttons is configured to count a first group of objects and the second set of input buttons is configured to count a second group of objects.

9. The counting device of claim 1, wherein the ergonomic shape enables a user to conduct thumb-typing while a hand, a wrist, and a forearm of the user is in the biomechanical neutral position.

10. The counting device of claim 1, wherein the instructions, when executed by the counting device, further enables the counting device to:
    provide count data from a plurality of counting devices to the counting device for display.

11. The counting device of claim 1, wherein the instructions, when executed by the counting device, further enables the counting device to:
    associate the user selection with one of position information, a time-stamp, image data, or audio data.

12. The counting device of claim 1, further comprising:
    at least one of a camera, microphone, or messaging interface to provide at least one of audio, video, text, or pictorial qualification of counts.

13. A counting system, comprising:
    a plurality of counting devices, individual counting devices having,
        a housing having a front portion, a back portion, a top portion, and a bottom portion, the bottom portion having a grip section that includes a through-hole sized for at least one finger to pass through, the housing having an ergonomic shape that is quantified based on a biomechanical neutral position,
        a controller comprising a set of input buttons an increment button operable to increment a count and a decrement button operable to decrement the count, and
        a display screen configured to display at least one of a total count or an absolute count based on user input at the plurality of counting devices; and
    at least one server configured to receive data representing a count of items.

14. The counting system of claim 13, further comprising:
    a memory device including instructions that, when executed by the counting system, enables the counting system to:
        receive the count of the items,
        store the count of the items, and
        enable access to the count of the items by the plurality of counting devices.

15. The counting system of claim 13, further comprising:

a memory device including instructions that, when executed by the counting system, enables the counting system to:

enable access to an interface displaying one of a category total of the count of the items or an absolute total of the count of the items.

16. The counting system of claim 13, further comprising:

a memory device including instructions that, when executed by the counting system, enables the counting system to:

provide configuration information to one of the plurality of counting devices, the configuration information operable to associate the set of input buttons with a counting category, indicate an account for providing count data, display at least one category for counting, indicate a location for counting, or provide a layout to view count data.

17. The counting system of claim 13, further comprising:

a graphical user interface operable allow a user to access a count of the items.

18. A computing device, comprising:

a housing having a front portion, a back portion, a top portion, and a bottom portion, the bottom portion having a grip section that includes a through-hole sized for at least one finger to pass through, the housing having an ergonomic shape that is quantified based on a biomechanical neutral position;

a controller comprising a set of input buttons an increment button operable to increment a count and a decrement button operable to decrement the count; and a display screen configured to display at least one of a total count or an absolute count based on user input at a plurality of counting devices.

19. The computing device of claim 18, wherein the biomechanical neutral position is based on an alignment of bodily features satisfying a threshold degree of alignment.

20. The computing device of claim 19, wherein the alignment of the bodily features is between a first target area of a first bodily feature and a second target area of a second bodily feature, and wherein the first bodily feature corresponds to a radius bone and the second bodily feature corresponds to a proximal interphalangeal joint of an index finger of a user.

* * * * *